(12) United States Patent
Murata

(10) Patent No.: US 7,096,579 B2
(45) Date of Patent: Aug. 29, 2006

(54) METHOD OF MANUFACTURING AN OPTICAL DEVICE

(75) Inventor: Akihiro Murata, Takane-cho (JP)

(73) Assignee: Seiko Epson Corporation, Tokyo (JP)

(*) Notice: Subject to any disclaimer, the term of this patent is extended or adjusted under 35 U.S.C. 154(b) by 284 days.

(21) Appl. No.: 10/778,107

(22) Filed: Feb. 17, 2004

(65) Prior Publication Data

US 2004/0158977 A1   Aug. 19, 2004

Related U.S. Application Data

(62) Division of application No. 09/971,619, filed on Oct. 9, 2001, now Pat. No. 6,724,061.

(30) Foreign Application Priority Data

Nov. 10, 2000 (JP) ............................. 2000-342907

(51) Int. Cl.
    *H05K 3/30* (2006.01)
(52) U.S. Cl. .................... 29/832; 29/592.1; 29/825; 445/25
(58) Field of Classification Search ............. 29/592.1, 29/825, 832; 445/25
    See application file for complete search history.

(56) References Cited

U.S. PATENT DOCUMENTS

| 4,139,250 | A | * | 2/1979 | Jacobs et al. ............... 445/25 |
| 4,210,462 | A | * | 7/1980 | Tourneux .................. 136/251 |
| 4,814,943 | A |   | 3/1989 | Okuaki |
| 5,357,056 | A |   | 10/1994 | Nagano |
| 5,886,467 | A | * | 3/1999 | Kimura .................... 313/582 |
| 5,997,379 | A | * | 12/1999 | Kimura .................... 445/25 |
| 6,130,448 | A |   | 10/2000 | Bauer et al. |
| 6,724,061 | B1 | * | 4/2004 | Murata .................... 257/433 |

FOREIGN PATENT DOCUMENTS

JP            408236738 A       9/1996

* cited by examiner

*Primary Examiner*—Carl J. Arbes
(74) *Attorney, Agent, or Firm*—Oliff & Berridge, PLC

(57) ABSTRACT

The invention provides an optical device having an optical element, a substrate, and a flexible member. A first portion of the flexible member is disposed so as to be spaced from the substrate, a second portion surrounding the first portion is adhered to the substrate, and a closed space is defined between the first portion and the substrate. The optical element is mounted on the substrate within the closed space.

1 Claim, 4 Drawing Sheets

METHOD OF MANUFACTURING AN OPTICAL DEVICE

This is a Divisional of application Ser. No. 09/971,619 filed Oct. 9, 2001. The entire disclosure of the prior application is hereby incorporated by reference herein in its entirety.

Japanese Patent Application No. 2000-342907, filed on Nov. 10, 2000, is hereby incorporated by reference in its entirety.

BACKGROUND OF THE INVENTION

1. Field of Invention

The present invention relates to an optical device and method of manufacture thereof and to an electronic instrument that incorporates the optical device.

2. Description of Related Art

An optical device having an optical element, such as a solid state imaging element, is known. In the packaging of a conventional optical device, the optical element is contained within a container, and a hermetic seal or the like is applied, so that the optical element is not exposed to moisture. In this way, a conventional optical device is provided with an expensive container to which a hermetic seal or the like is applied, and therefore tends to have a high cost.

SUMMARY OF THE INVENTION

An optical device of the present invention includes:
a substrate;
a flexible member having a first portion disposed so as to be spaced from the substrate, and a second portion surrounding the first portion and adhered to the substrate, in which a closed space is formed between the first portion and the substrate; and
an optical element disposed within the closed space, and mounted on the substrate.

An electronic instrument of the present invention incorporates the above described optical device.

A method of manufacturing an optical device of the present invention includes: mounting an optical element on a substrate; adhering a flexible member to the substrate so as to cover the optical element, to form a closed space between the substrate and the flexible member; and evacuating the closed space.

DETAILED DESCRIPTION OF PREFERRED EMBODIMENTS

Figure 1:
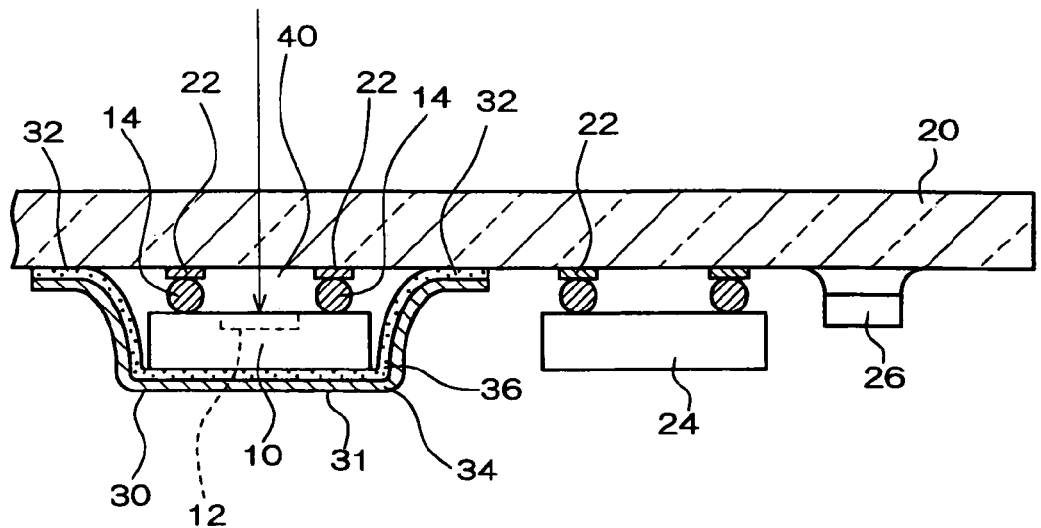
FIG. 1 is a sectional view of a first embodiment of the optical device of the present invention.

The embodiments of the present invention address the problems of the conventional art discussed above. It is an object of the invention to provide an optical device having a relatively simple construction, so as to be of relatively low cost and to allow a seal. It is also an object of the invention to provide a method of manufacture thereof and to an electronic instrument that incorporates the optical device.

An optical device according to the embodiment of the present invention includes:
a substrate;
a flexible member having a first portion disposed so as to be spaced from the substrate, and a second portion surrounding the first portion and adhered to the substrate, in which a closed space is formed between the first portion and the substrate; and
an optical element disposed within the closed space, and mounted on the substrate.

According to the embodiment of the present invention, since the second portion of the flexible member is simply adhered to the substrate, no container is required, and the optical element can be simply sealed therein.

In this optical device, at least a part of the substrate may have light transmissivity.

In this optical device, the optical element may be mounted on the substrate, with an optical portion of the optical element opposing a part of the substrate having light transmissivity.

In this optical device, the flexible member may have a metal foil and an adhesive layer adhered to the substrate.

This makes it possible to obtain an optical device of excellent moisture resistance, noise resistance, and thermal dispersion.

In this optical device, the flexible member may have a water repellent layer on a surface that is opposite to the side of the closed space.

This makes it possible to enhance the moisture resistance.

In this optical device, the closed space may be filled with an inert gas.

The inert gas can protect the optical element.

In this optical device, a pressure in the closed space may be closer to a pressure in a vacuum than atmospheric pressure.

Since the optical element is in a state that is close to a vacuum, it is not exposed to moisture.

In this optical device, the substrate may have a hole opening to the closed space and blocked at a surface that is opposite to the side of the closed space.

This configuration makes it possible to utilize the hole to fill the closed space with inert gas or for evacuation.

In this optical device, the hole that is formed in the substrate may be blocked by a valve.

The valve can be used to maintain the inert gas within the closed space or a state that is close to a vacuum.

In this optical device, the hole that is formed in the substrate may be blocked by resin.

The resin can be used to maintain the inert gas within the closed space or a state that is close to a vacuum.

In this optical device, the substrate may have a hole that is blocked on a surface on the side of the closed space by the flexible member, and opening on a surface that is opposite to the side of the closed space.

The flexible member can be used to maintain the inert gas within the closed space or a state that is close to a vacuum.

In this optical device, the closed space may be filled with transparent resin.

The transparent resin can protect the optical element.

In this optical device, the substrate may have a penetrating hole that is filled with transparent resin.

The transparent resin can be used to maintain the inert gas within the closed space or a state that is close to a vacuum.

An electronic instrument according to the embodiment of the present invention incorporates the above described optical device.

A method of manufacturing an optical device according to the embodiment of the present invention includes: mounting an optical element on a substrate; adhering a flexible member to the substrate so as to cover the optical element, to form a closed space between the substrate and the flexible member; and evacuating the closed space.

According to the embodiment of the present invention, since the flexible member is simply adhered to the substrate to evacuate the closed space, no container is required, and the optical element can be simply sealed therein.

In this method of manufacturing an optical device, evacuation may be performed through a penetrating that is hole formed in the substrate, and the hole may be then blocked by resin.

The resin can maintain a state that is close to a vacuum within the closed space.

In this method of manufacturing an optical device, evacuation may be performed through a penetrating hole that is formed in the substrate, and the hole may be then blocked by a valve.

The valve can maintain a state that is close to a vacuum within the closed space.

In this method of manufacturing an optical device, evacuation may be performed through a penetrating hole that is formed in the substrate, and the hole may be then blocked by the flexible member.

The flexible member can maintain a state that is close to a vacuum within the closed space.

This method of manufacturing an optical device may further include:

filling the closed space with transparent resin, wherein evacuation may be performed through a penetrating hole formed in the substrate, and the hole may be then blocked by the transparent resin.

The transparent resin can maintain a state that is close to a vacuum within the closed space.

The embodiments of the present invention will be described with reference to the drawings.

First Embodiment

FIG. 1 shows a first embodiment of the optical device of the present invention. The optical device has at least one (one or a plurality) optical element 10. The optical element 10 has an optical portion 12. The optical element 10 may either be a photoreceptor element or a photoemitter element. When the optical element 10 is a photoemitter element, the optical portion 12 is a light-emitting portion, and when the optical element 10 is a photoreceptor element, the optical portion 12 is a light-receiving portion.

In this embodiment, the optical element 10 is an imaging element (image sensor). If it is a two-dimensional image sensor, a plurality of photoreceptors (for example, photodiodes) constituting a plurality of pixels forms the optical portion 12. If it is a CCD (Charge Coupled Device) type of imaging element, it has a transfer section (not shown in the drawings), and the electric charge from the photoreceptor for each of the pixels is transferred at high speed. As a variant example that is different from this embodiment, the optical element 10 may be a surface photoemitter element, and in particular a surface emission laser. A surface photoemitter element, such as a surface emission laser, emits light in a direction that is perpendicular to the substrate on which the element is constituted.

In order to provide electrical connection with the exterior of the device, the optical element 10 may have one or more (in this embodiment a plurality) bumps 14. For example, on the surface on which the optical portion 12 is formed, bumps 14 may be provided to accomplish electrical connection of the optical element 10 with the exterior of the device. The bumps 14 are provided in positions to allow electrical connection with other elements. The bumps 14 preferably project beyond the optical portion 12.

The optical device has a substrate 20. At least a part of the substrate 20 (a part allowing light to pass to the optical element 10) has light transmissivity. The substrate 20 shown in FIG. 1 has light transmissivity overall, and is, for example, a glass substrate. An interconnecting pattern 22 is formed on the substrate 20. The interconnecting pattern 22 may have lands formed as regions that are bonded to the optical element 10 or the like. Provided that the electrical connection is not interfered with, the interconnecting pattern 22 is preferably covered with another element (for example, a resist or the like not shown in the drawings). The interconnecting pattern 22 shown in FIG. 1 is only formed on one surface of the substrate 20. However, the interconnecting pattern 22 may be formed on both surfaces of the substrate 20 and electrically connected by through holes (not shown in the drawings) or the like.

The optical element 10 is mounted on the substrate 20 with the optical portion 12 facing the substrate 20 (more precisely a portion having light transmissivity thereof). That is to say, the optical element 10 is mounted on the substrate 20 to form a face-down construction. The bumps 14 of the optical element 10 and the interconnecting pattern 22 are bonded. If necessary, the optical element 10 and interconnecting pattern 22 may be electrically connected by wires (not shown in the drawings). In this embodiment, on the substrate 20, in addition to the optical element 10, electronic components 24 and 26 are mounted.

The optical device has a flexible member 30. Tape or a sheet form may be used as the flexible member 30. The flexible member 30 may include multiple layers. The flexible member 30 shown in FIG. 1 has a base layer 34 and an adhesive layer 36. The base layer 34 may have at least one of the properties of not allowing moisture to pass (or having high resistance to moisture), of not allowing magnetism to pass, and of having high thermal dispersion. By means of this, an optical device of high moisture resistance, noise resistance, and thermal dispersion is obtained. The base layer 34 may be opaque, enabling light to be prevented from entering the optical element 10. By means of this, an optical device of low light-induced misoperation is obtained. If the base layer 34 is a metal foil of aluminum, copper, or the like, these requirements can be satisfied. The adhesive layer 36 is formed of an adhesive, such as an epoxy resin, an acrylic resin, a silicone resin, or the like. The adhesive layer 36 may be provided over the entire area of the base layer 34, or may only be provided in a part of the base layer 34 (for example, the second portion 32 described below).

A first portion 31 of the flexible member 30 is disposed so as to be spaced apart from the substrate 20. The first portion 31 is a portion of the flexible member 30 excluding the extremity (for example, the first portion is defined as the center portion). A region that is surrounded by the second portion 32 (for example, the second portion 32 being the extremity) is the first portion 31. The flexible member 30 includes the second portion 32 (for example, the extremity) which surrounds the first portion 31 that is adhered to the substrate 20. The adhesive layer 36 can be disposed on the substrate 20, and the flexible member 30 and the substrate 20 adhered by the adhesive layer 36. In this case, the adhesive layer 36 is an inner layer, and the base layer 34 is an outer layer.

A closed space 40 is defined between the first portion 31 and the substrate 20. The first portion 31 and the substrate 20 are preferably in intimate contact in order to enable the closed space 40 to be maintained as airtight. The optical element 10 is provided within the closed space 40. In more detail, surrounding the optical element 10, the first portion 31 is adhered to the substrate 20, and the second portion 32 covers the optical element 10. It is preferable for moisture to be low within the closed space 40. For example, the closed space 40 may contain a vacuum (Strictly speaking, a state that is closer to a vacuum than atmospheric pressure. The same applies subsequently.), or may be filled with an inert gas ($N_2$ or the like). In these environments, the optical element 10 is protected so as not to be exposed to moisture. According to this embodiment, the optical element 10 can be sealed with a simple construction.

In this embodiment of the optical device, the optical element 10 is a photoreceptor element, and light which has passed through the substrate 20 impinges on the optical element 10. Alternatively, as a variant example, if the optical element 10 is a photoemitter element, light emitted from the optical element 10 passes through the substrate 20 and is output.

This embodiment of the optical device is constructed as described above, and the method of manufacture thereof is described below. In this embodiment, the optical element 10 is mounted on the substrate 20, and the flexible member 30 is adhered to the substrate 20 so as to cover the optical element 10. In more detail, the optical element 10 is covered by the first portion 31 of the flexible member 30, and the second portion 32 surrounding this structure is adhered to the substrate 20. An adhesive may be used for the adhesion of the flexible member 30 and the substrate 20. For example, the flexible member 30 may be previously provided with the adhesive. In this embodiment, the adhesive layer 36 of the flexible member 30 adheres the flexible member 30 (second portion 32) and the substrate 20.

Then, the closed space 40 is formed between the substrate 20 and the flexible member 30. If the flexible member 30 is adhered to the substrate 20 in a vacuum, a vacuum will exist within the closed space 40. If the flexible member 30 is adhered to the substrate 20 in an environment that is filled with an inert gas, the closed space 40 can be filled with an inert gas. The optical element 10 is sealed and protected within the closed space 40. According to this embodiment, the optical element 10 can be sealed by a simple process.

The present invention is not limited to the above described embodiment, and various variants are possible. Other embodiments are now described.

Second Embodiment

Figure 2:
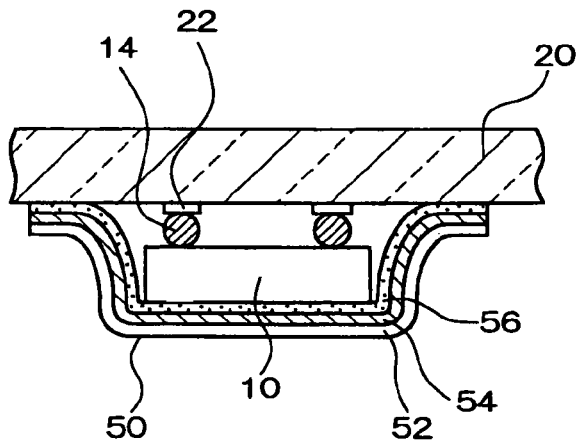
FIG. 2 is a sectional view of a second embodiment of the optical device of the present invention.

FIG. 2 shows a second embodiment of the optical device of the present invention. This embodiment differs from the first embodiment in that a flexible member 50 has a water repellent layer 52. The water repellent layer 52 is formed on the opposite surface of a base layer 54 from the surface on which an adhesive layer 56 is formed. A fluorine coating may be used as the water repellent layer 52. The water repellent layer 52 forms a protective film, and enhances the moisture resistance of the optical device. The water repellent layer 52 may be such as to be able to be melted by a laser. In this case, marking is possible.

With respect to the remaining construction, the effect, and the method of manufacture, this embodiment corresponds to the description of the first embodiment.

Third Embodiment

Figure 3:
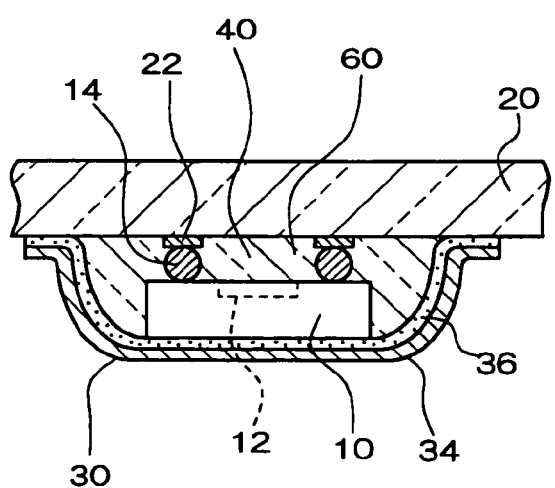
FIG. 3 is a sectional view of a third embodiment of the optical device of the present invention.

FIG. 3 shows a third embodiment of the optical device of the present invention. This embodiment differs from the first embodiment in that the closed space 40 is filled with transparent resin 60. The transparent resin 60 is provided over the optical portion 12 of the optical element 10. The transparent resin 60 need only transmit light to the extent to allow light to be input to the optical element 10 (or lights to be input from the optical element 10). By means of this, the optical element 10 is protected by the transparent resin 60. With respect to the remaining construction, the effect, and the method of manufacture, this embodiment corresponds to the description of the first embodiment.

Fourth Embodiment

Figure 4:
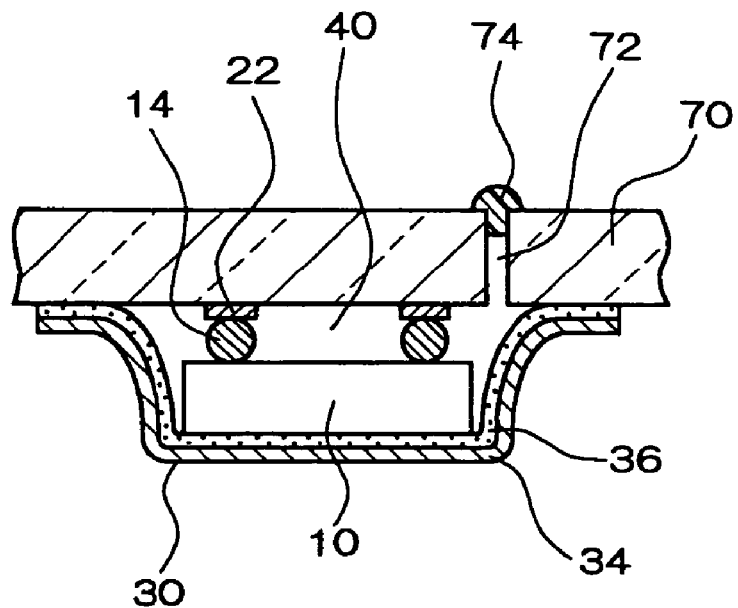
FIG. 4 is a sectional view of a fourth embodiment of the optical device of the present invention.

FIG. 4 shows a fourth embodiment of the optical device of the present invention. This embodiment differs from the first embodiment in that a hole 72 is formed in a substrate 70. The hole 72 passes through the substrate 70, and opens in the closed space 40. The hole 72 is blocked. Resin may be provided to block the hole 72. The resin 74 may be provided on the opposite side of the substrate 70 from the closed space 40. The resin 74 may penetrate into the hole 72.

In this embodiment, the closed space 40 contains a vacuum (strictly speaking, a state that is closer to a vacuum than atmospheric pressure). For example, by means of the hole 72, the closed space 40 can be connected to the exterior of the device, and a vacuum created, whereby the closed space 40 contains a vacuum, and then the hole 72 may be blocked by the resin 74 or the like. By means of this, the closed space 40 can be evacuated simply. With respect to the remaining construction, the effect, and the method of manufacture, this embodiment corresponds to the description of the first embodiment.

Fifth Embodiment

Figure 5:
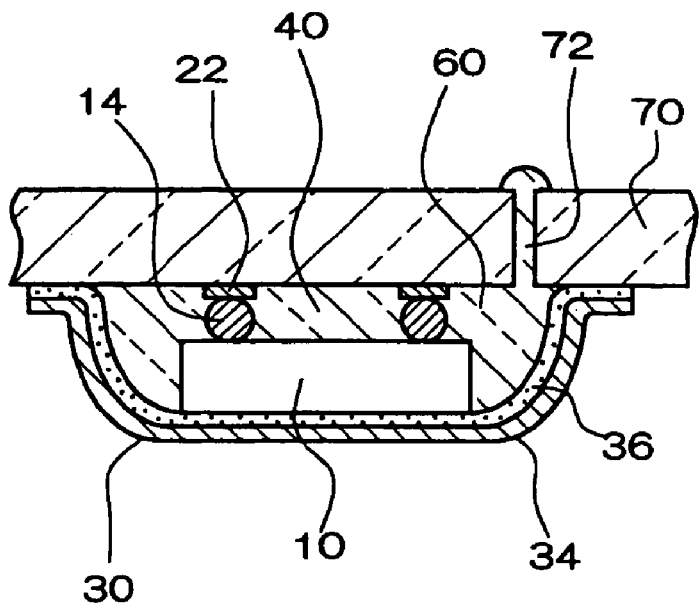
FIG. 5 is a sectional view of a fifth embodiment of the optical device of the present invention.

FIG. 5 shows a fifth embodiment of the optical device of the present invention. In this embodiment, the hole 72 is formed in the substrate 70 (in detail, as described in the fourth embodiment), and the closed space 40 is filled with transparent resin 60 (in detail, as described in the third embodiment). The transparent resin 60 is also provided in the hole 72, and by means of this, the hole 72 is blocked.

After previously evacuating the closed space 40, the closed space 40 may be filled with the transparent resin 60 through the hole 72. Alternatively, the transparent resin 60 may be provided to seal the optical element 10, and after adhering the flexible member 30, the foam within the closed space 40 may be removed through the hole 72.

With respect to the remaining construction, the effect, and the method of manufacture, this embodiment corresponds to the description of the first, third, and fourth embodiments.

Sixth Embodiment

Figure 6:
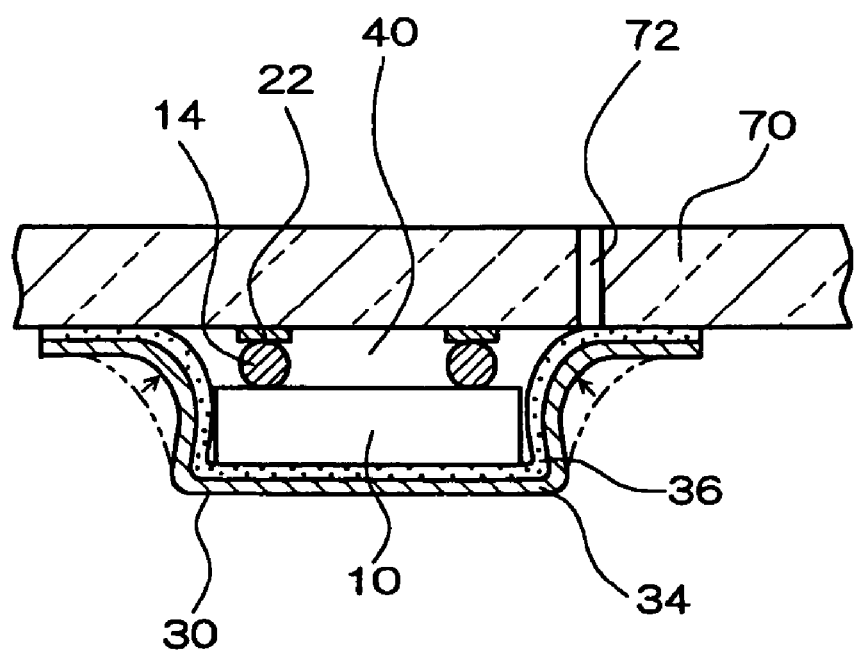
FIG. 6 is a sectional view of a sixth embodiment of the optical device of the present invention.

FIG. 6 shows a sixth embodiment of the optical device of the present invention. In this embodiment, the hole 72 is formed in the substrate 70 (in detail, as described in the fourth embodiment), and the hole 72 is blocked by the flexible member 30. In more detail, the hole 72 is blocked on the surface of the substrate 70 that is opposite to the closed space 40. The portion of the flexible member 30 blocking the hole 72 is the portion adhered to the substrate 70. The hole 72 may be left open on the surface of the substrate 70 that is opposite to that of the closed space 40, or may be filled with resin or the like, or may be used as a hole for attachment to another element, or to position.

In the method of manufacture of this embodiment of the optical device, the flexible member 30 is first adhered to the substrate 70 so as not to block the hole 72. Through the hole 72, the closed space 40 is evacuated, and the flexible member 30 is pulled in the direction of the closed space 40, to obtain this embodiment. By means of this, by mere evacuation, the hole 72 can be blocked. With respect to the remaining construction, the effect, and the method of manufacture, this embodiment corresponds to the description of the first and fourth embodiments.

Seventh Embodiment

Figure 7:
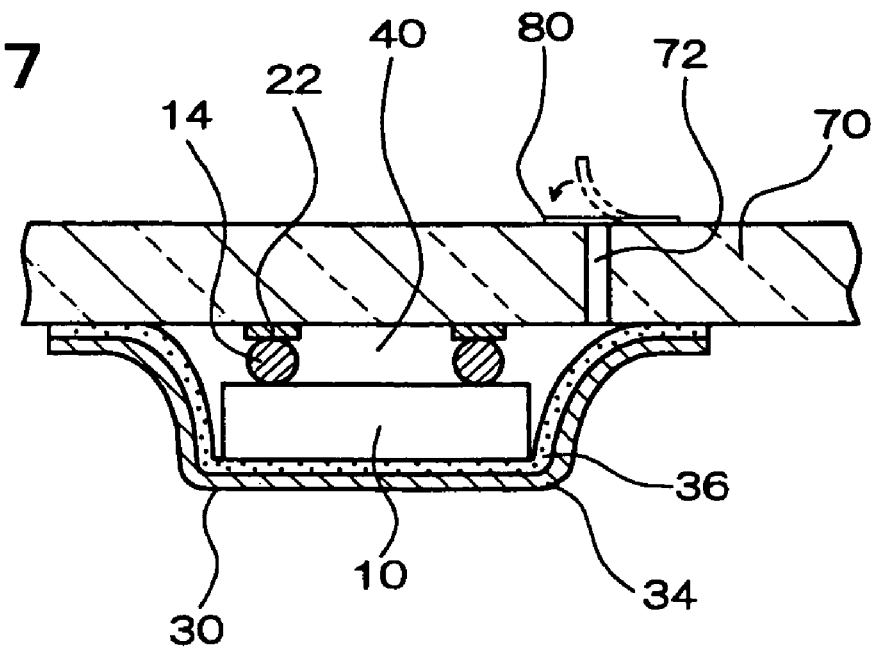
FIG. 7 is a sectional view of a seventh embodiment of the optical device of the present invention.

FIG. 7 shows the seventh embodiment of the optical device of the present invention. In this embodiment, the hole 72 is formed in the substrate 70 (in detail, as described in the fourth embodiment), and the hole 72 is blocked by a valve 80. The valve 80 is provided, for example, on the surface of the substrate 70 opposite to that of the closed space 40. The valve 80 may be a film. The valve 80 is opened, the closed space 40 is evacuated through the hole 72, and the hole 72 is blocked by the valve 80. With respect to the remaining construction, the effect, and the method of manufacture, this embodiment corresponds to the description of the first and fourth embodiments.

Figure 8:
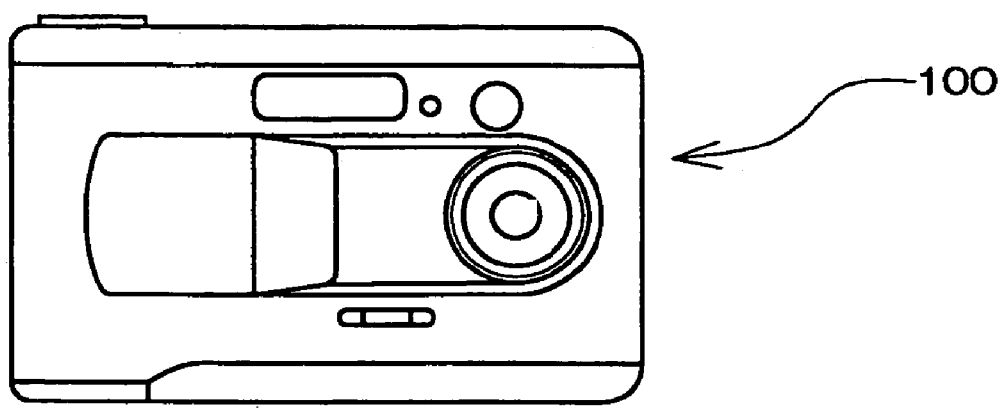
FIG. 8 is a plan view of an electronic instrument incorporating the optical device according to the present invention.

It should be noted that FIG. 8 shows a digital camera 100, as an example of an embodiment of an electronic instrument to which the present invention is applied. The digital camera 100 has incorporates the above described optical device.

What is claimed is:

1. A method of manufacturing an optical device, comprising:
   mounting an optical element on a substrate, the substrate having a penetrating hole;
   adhering a flexible member to the substrate so as to cover the optical element, to define a closed space between the substrate and the flexible member;
   evacuating the closed space through the penetrating hole;
   filling the closed space with transparent resin; and
   blocking the hole with the transparent resin.

* * * * *